United States Patent
Kitano (10) Patent No.: US 9,439,323 B2
(45) Date of Patent: Sep. 6, 2016

(54) ELECTRONIC DEVICE AND METHOD FOR CONTROLLING TEMPERATURE OF ELECTRONIC DEVICE

(71) Applicant: NEC Computertechno, Ltd., Yamanashi (JP)

(72) Inventor: Masaaki Kitano, Yamanashi (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 528 days.

(21) Appl. No.: 14/023,074

(22) Filed: Sep. 10, 2013

(65) Prior Publication Data
US 2014/0079533 A1    Mar. 20, 2014

(30) Foreign Application Priority Data

Sep. 18, 2012 (JP) ................................. 2012-203854

(51) Int. Cl.
F04D 29/00 (2006.01)
H05K 7/20 (2006.01)
G06F 1/20 (2006.01)

(52) U.S. Cl.
CPC ........... *H05K 7/20136* (2013.01); *G06F 1/206* (2013.01); *H05K 7/20209* (2013.01)

(58) Field of Classification Search
CPC ..................... H05K 7/20136; H05K 7/20209; G06F 1/206; F04D 15/0066; F05D 2270/03; F05D 2270/303; F05D 2270/313; F05D 2270/44; F24F 11/053; F24F 2011/0006; F24F 2011/0013; F24F 2011/0063
USPC ............... 700/299, 153, 202, 203, 204, 205; 415/17, 47, 35, 37, 39
See application file for complete search history.

(56) References Cited

U.S. PATENT DOCUMENTS

2008/0009980 A1* 1/2008 Chang .................... G06F 1/206
                                                                       700/299

FOREIGN PATENT DOCUMENTS

| JP | 63-226891   | 9/1988  |
|----|-------------|---------|
| JP | 2001-21420  | 1/2001  |
| JP | 2007-295247 | 11/2007 |
| JP | 2008-042597 | 2/2008  |
| JP | 2009-069459 | 4/2009  |
| JP | 2011-59739  | 3/2011  |
| JP | 2012-145793 | 8/2012  |

OTHER PUBLICATIONS

Japanese Office Action mailed Jun. 7, 2016, by the Japanese Patent Office in counterpart Japanese Patent Application No. 2012-203854.

* cited by examiner

*Primary Examiner* — Dwayne J White
*Assistant Examiner* — Jason Mikus
(74) *Attorney, Agent, or Firm* — Finnegan, Henderson, Farabow, Garrett & Dunner LLP

(57) ABSTRACT

An object of the present invention is to provide an electronic device in which a temperature control using a cooling fan can be made more efficiently and more stably and a method for controlling temperature of a device.
The device includes the fan, a measurement unit, and a control unit which controls a rotation speed of the fan based on the measured temperature. The control unit stores a plurality of measured temperatures and a normal temperature range for each measurement unit, determines the presence or absence of a temperature increasing trend, shortens a time interval when it is determined that increases, determines whether or not the plurality of temperatures are included in the normal range when it is determined that does not increase, prolongs when the all are included in the normal range, and does not change when at least one is not included in the normal range.

8 Claims, 6 Drawing Sheets

| TEMPERATURE RANGE (°C) | ~25 | 25~40 | 40~ |
|---|---|---|---|
| ROTATION SPEED (rpm) | 2000 | 3000 | 4000 |

Fig.6

| LEVEL | 1 | 2 | 3 | 4 | 5 |
|---|---|---|---|---|---|
| MEASUREMENT INTERVAL (S) | 2 | 5 | 10 | 15 | 25 |

ELECTRONIC DEVICE AND METHOD FOR CONTROLLING TEMPERATURE OF ELECTRONIC DEVICE

This application is based upon and claims the benefit of priority from Japanese Patent Application No. 2012-203854, filed on Sep. 18 2012, the disclosure of which is incorporated herein in its entirety by reference.

TECHNICAL FIELD

The present invention relates to an electronic device in which air cooling is performed and a method for controlling temperature of an electronic device.

BACKGROUND ART

Figure 5:
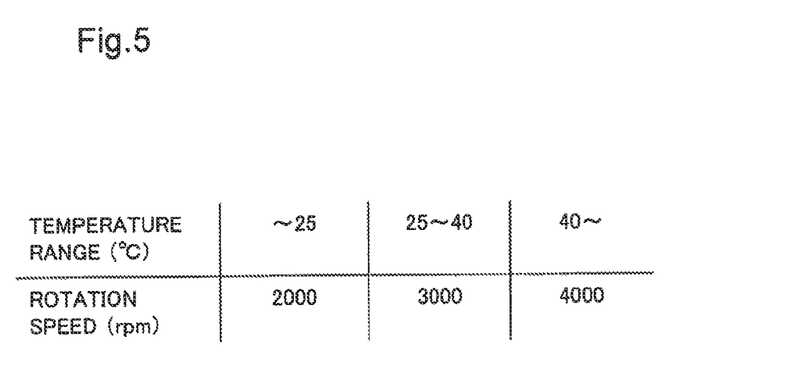
FIG. 5 shows an example of a relationship between a temperature range and a rotation speed.
Figure 7:
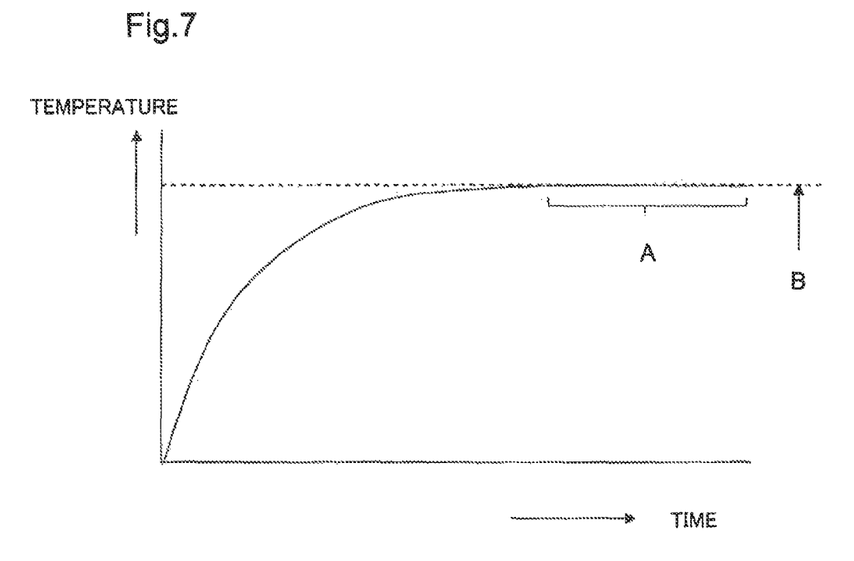
FIG. 7 is a figure showing in a temperature change inside an electronic device.

Generally, because an electronic device is required to have a reduced thickness, a reduced weight, and a reduced size, electronic components are densely arranged and used in the device. For this reason, a cooling capacity (rotation speed) of a cooling fan, the number of cooling fans, an installation position of a cooling fan, and the like are determined so that the temperature of the electronic component does not exceed the upper limit of the operating temperature. As shown in FIG. 7, the temperature inside the electronic device becomes stable at a predetermined temperature that is lower than the upper limit of the operating temperature of the electronic component. In the electronic device, in order to avoid fast temperature rise of the electronic component and the like, as shown in FIG. 5, the rotation speed of the cooling fan is changed in stages according to the temperature inside the device and the like to control the temperature.

Figure 8:
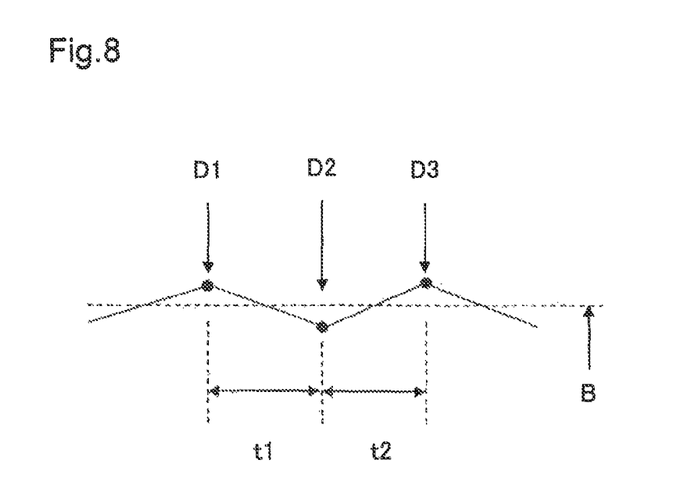
FIG. 8 is a figure showing in a temperature change inside an electronic device in detail.

FIG. 8 shows in detail the temperature change inside the electronic device in a state in which the temperature inside the electronic device is stable (a part A shown in FIG. 7).

A temperature change measured by a temperature sensor is shown by a solid line. The threshold temperature B is shown by a dashed line B. The cooling fan is set so as to rotate at the maximum speed when the measured temperature exceeds a threshold temperature B in a normal operation state.

When the measured temperature inside the electronic device exceeds the threshold temperature B, the rotation speed of the cooling fan is increased and the temperature is decreased (D1). When the measured temperature is lower than the threshold temperature B, the rotation speed of the cooling fan is decreased and the temperature increases (D2). When the measured temperature exceeds the threshold temperature B again, the rotation speed of the cooling fan is increased and the temperature is decreased (D3). By repeating this operation, the electronic device makes the temperature inside the device during operation stable so that the temperature of the electronic component does not exceed the upper limit of the operating temperature.

In a generally-used temperature control method, a temperature sensor is installed in the device and the rotation speed of the fan is controlled based on the temperature measured continuously or periodically by the temperature sensor. An example of this method is disclosed in patent document 1.

In patent document 1, a device which generates a control voltage based on the temperature measured by the temperature sensor and controls a rotation speed of a cooling fan based on the control voltage and a cooling method are disclosed.

However, because the device disclosed in patent document 1 operates continuously or periodically, a rotation speed control unit operates even when the temperature is stable. Therefore, a problem in which an electric power is unnecessarily consumed and the rotation speed control unit generates heat by its operation occurs.

As one of the countermeasures against this problem, in patent document 2, a method in which a measurement interval is varied based on the temperature measured by the temperature sensor is described.

In the invention disclosed in patent document 2, when the temperature measured by the temperature sensor is within a predetermined temperature range, the measured temperature is compared with the preceding measured temperature. When the temperature increase is small, the measurement interval is made long and when the temperature increase is large, the measurement interval is made short. Further, a projector in which when the measured temperature exceeds the predetermined temperature range, the fan is rotated at the maximum speed is disclosed.

PRIOR ART DOCUMENT

Patent Document

[patent document 1] Japanese Patent Application Laid-Open No. 2008-042597
[patent document 2] Japanese Patent Application Laid-Open No. 2009-069459

SUMMARY

Problems to be Solved by the Invention

However, in the invention described in patent document 2 in which the above-mentioned problem of the invention described in patent document 1 is solved, the measured temperature is compared with the preceding measured temperature and when the temperature increase is small, the measurement interval is made long. Therefore, in a state in which the measured temperature inside the electronic device is stable, the measurement interval (t2 in FIG. 8) becomes long. Accordingly, because the measurement interval is made long, a problem in which the measured temperature (D3 in FIG. 8) at which the cooling fan is rotated at the maximum speed becomes high occurs.

Therefore, an object of the present invention is to provide an electronic device in which a temperature control using a cooling fan can be made more efficiently and more stably and a method for controlling temperature of an electronic device.

Means for Solving the Problems

An electronic device of the present invention including a cooling fan, at least one temperature measurement unit, and a temperature control unit which controls a rotation speed of the cooling fan based on the measured temperature measured by the temperature measurement unit to control the temperature inside the device is characterized in that the temperature control unit stores at least a plurality of measured temperatures that are measured at predetermined time intervals in the past in chronological order from the latest measured temperature, stores a normal temperature range for each temperature measurement unit, determines the presence or absence of a temperature increasing trend based on the plurality of measured temperatures and the latest measured temperature that are stored, shortens the time interval between temperature measurements from the current time interval when it is determined that the temperature increases, determines whether or not the plurality of measured temperatures and the latest measured temperature are included in the normal temperature range when it is determined that the temperature does not increase, prolongs the time interval between temperature measurements from the current time interval when all the measured temperatures are included in the normal temperature range, and does not change the time interval between temperature measurements when at least one measured temperature is not included in the normal temperature range.

A method for controlling temperature of an electronic device of the present invention which includes a cooling fan, at least one temperature measurement unit, and a temperature control unit which controls a rotation speed of the cooling fan based on the measured temperature measured by the temperature measurement unit to control the temperature inside the device is characterized by comprising the steps of: storing at least a plurality of measured temperatures that are measured at predetermined time intervals in the past in chronological order from the latest measured temperature, storing a normal temperature range for each temperature measurement unit, determining the presence or absence of a temperature increasing trend based on the plurality of measured temperatures and the latest measured temperature that are stored, shortening the time interval between temperature measurements from the current time interval when it is determined that the temperature increases, determining whether or not the plurality of measured temperatures and the latest measured temperature are included in the normal temperature range when it is determined that the temperature does not increase, prolonging the time interval between temperature measurements from the current time interval when all the measured temperatures are included in the normal temperature range, and not changing the time interval between temperature measurements when at least one measured temperature is not included in the normal temperature range.

Effect of the Invention

By using the present invention, a temperature control using a cooling fan in an electronic device can be made more efficiently and more stably.

EXEMPLARY EMBODIMENT

A first exemplary embodiment of the present invention will be described with reference to a figure.

Figure 1:
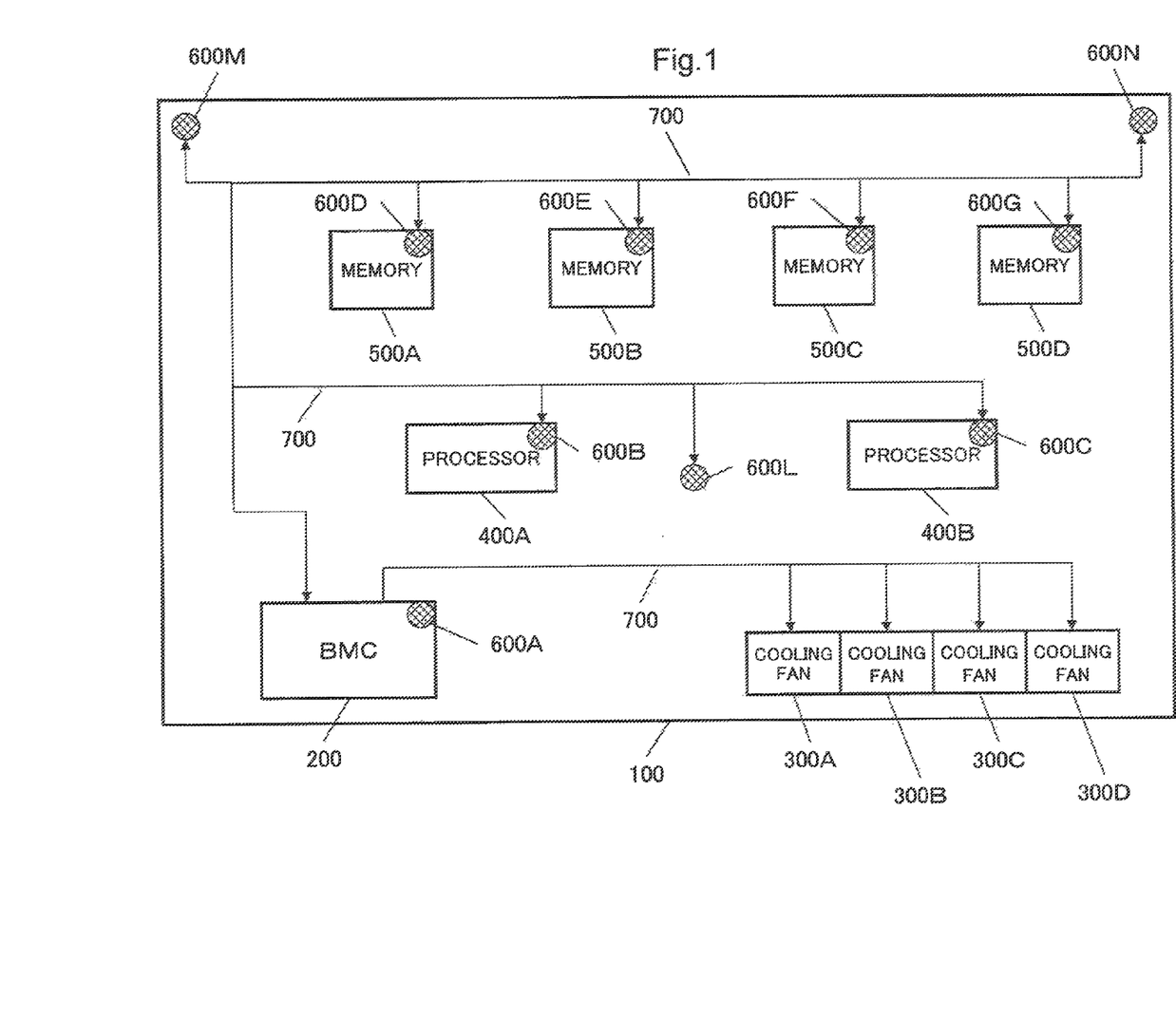
FIG. 1 is a block diagram showing a configuration of an electronic device 100 according to an exemplary embodiment of the present invention.

FIG. 1 is a block diagram showing a configuration of an electronic device 100 according to the exemplary embodiment of the present invention.

The electronic device 100 includes a BMC (Baseboard Management Controller) 200 which controls the temperature in the device by a rotation speed of a cooling fan, cooling fans 300 (300A to 300D) which send cooling air in the device, and temperature sensors 600 (600A to 600G and 600L to 600M) which measure temperature at an installation position at which the sensor is installed as a component for controlling the temperature in the device.

In an example shown in FIG. 1, the electronic device 100 further includes processors 400 (400A and 400B) which control the electronic device 100, memories 500 (500A to 500D) which store data, a signal, and the like, and a signal circuit 700 which is a transmission route of the signal. The temperature sensor 600 is mounted in a component whose temperature has to be monitored, installed in the vicinity of the component, or mounted in the BMC 200, the processors 400, and the memories 500 in advance. An unique sensor code is assigned to each temperature sensor of the temperature sensors 600 and the sensor code is stored in a temperature sensor read unit 212 of the BMC 200.

Figure 2:
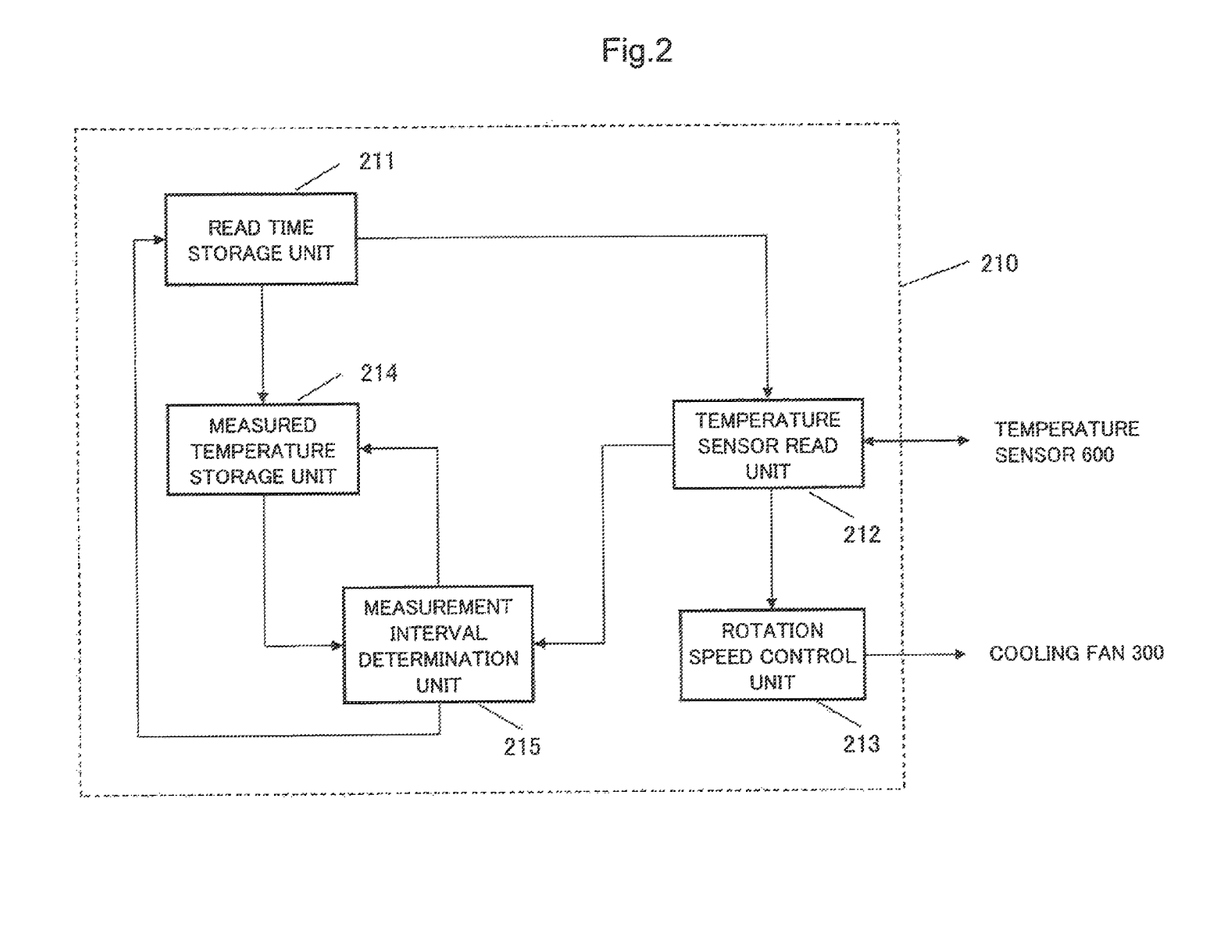
FIG. 2 is a block diagram showing a configuration of a temperature control unit 210 in a BMC 200.

FIG. 2 is a block diagram showing an example of a configuration of a temperature control unit 210 in the BMC 200.

The temperature control unit 210 in the BMC 200 includes a read time storage unit 211 which stores each sensor code and a read time for each sensor code, a temperature sensor read unit 212 which reads the temperature of the temperature sensor for each sensor code, a rotation speed control unit 213 which stores a rotation speed of the cooling fan for each sensor code and the current rotation speed of the cooling fan and controls the rotation speed of the cooling fan, a measured temperature storage unit 214 which stores a plurality of measured temperatures that are measured in the past in chronological order from the latest measured temperature for each sensor code, and a measurement interval determination unit 215 which stores a measurement interval that is a read time interval of the temperature sensor for each sensor code and controls the measurement interval.

A process of controlling the measurement interval of the temperature sensor in the temperature control unit 210 will be described.

Figure 3:
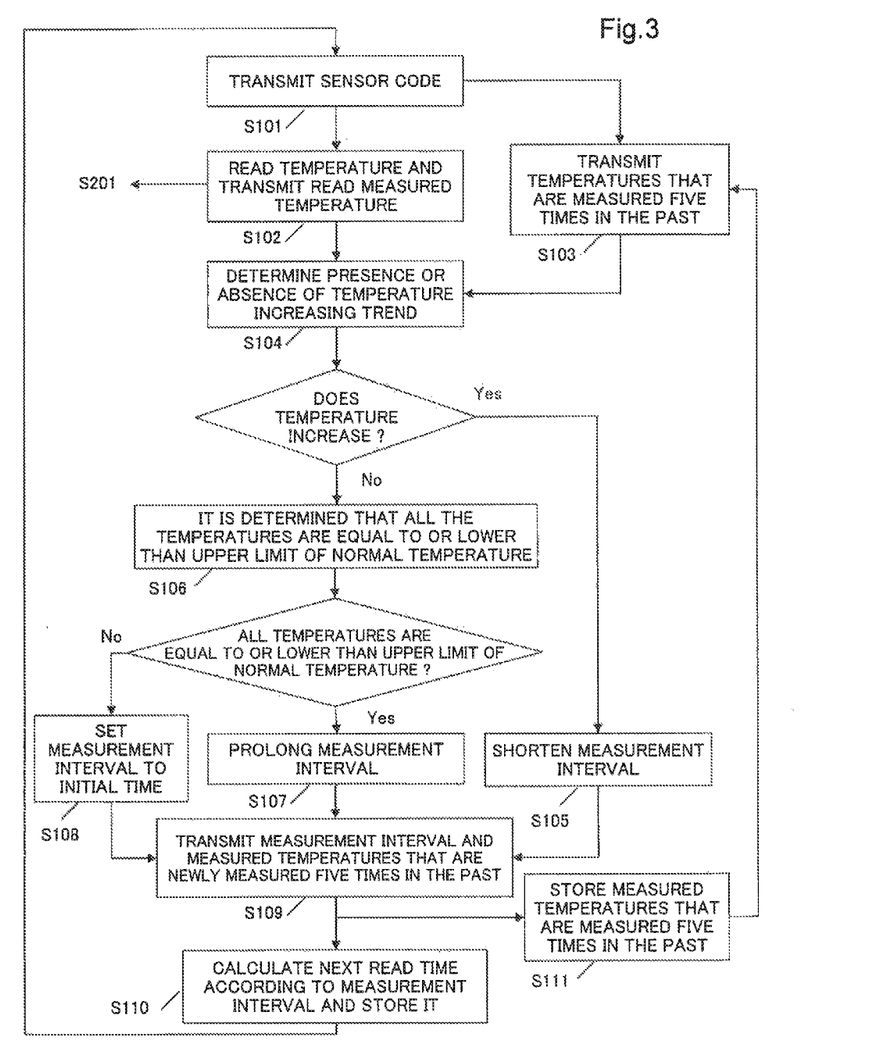
FIG. 3 is a flowchart showing an example of a process of controlling a measurement interval in a temperature control unit 210.

FIG. 3 is a flowchart showing an example of a process of controlling the measurement interval of the temperature sensor in the temperature control unit 210.

The read time storage unit 211 stores the read time for each sensor code. When the stored read time is reached, the read time storage unit 211 adds a flag indicating that the process is performed to the sensor code and transmits the sensor code to the temperature sensor read unit 212 and the measured temperature storage unit 214 (step S101).

The temperature sensor read unit 212 associates the temperature sensor with the sensor code and stores them. When the temperature sensor read unit 212 receives the sensor code, the temperature sensor read unit 212 reads the temperature of the temperature sensor for the sensor code and transmits at least the read measured temperature, together with the sensor code, to the rotation speed control unit 213 and the measurement interval determination unit 215 (step S102).

The measured temperature storage unit 214 stores the temperatures that are measured five times in the past in chronological order for each sensor code. When the measured temperature storage unit 214 receives the sensor code, the measured temperature storage unit 214 transmits the temperatures that are measured five times in the past by the temperature sensor for the sensor code to the measurement interval determination unit 215 (step S103). Further, the number of the measured temperatures stored by the measured temperature storage unit 214 is one example.

The measurement interval determination unit 215 stores a normal temperature range for each sensor code, receives the latest measured temperature and the temperatures that are measured five times in the past, and determines the presence or absence of the temperature increasing trend (step S104). When it is determined that the temperature increases, the measurement interval determination unit 215 shortens the measurement interval for the next measurement made by the temperature sensor for the sensor code (step S105). As an example, the measurement interval is set to 5 seconds.

Here, the presence or absence of the temperature increasing trend is determined based on one of the following three conditions and when one of the conditions is satisfied, it is determined that the temperature increases. A first condition: the latest measured temperature exceeds the upper limit of the normal temperature range (hereinafter, described as a normal upper limit) in the device. A second condition: with respect to the latest measured temperature and the temperatures that are measured five times in the past, it is determined that the temperature monotonically increases with time. In other words, with respect to the latest measured temperature and the temperatures that are measured five times in the past, each measured temperature is higher than the preceding measured temperature. A third condition: there is a positive correlation between the time and the measured temperature, which indicates that the temperature increases with time, in the latest measured temperature and the temperatures that are measured five times in the past. When an inclination (A) of a linear function (Y=AX+B) of the time (X) and the measured temperature (Y) that is calculated by for example, the method of least squares is positive, there is a positive correlation.

When it is determined that the temperature does not increase, the measurement interval determination unit 215 decides that the latest measured temperature and the temperatures that are measured five times in the past are equal to or lower than the normal upper limit (step S106). When all the measured temperatures are equal to or lower than the normal upper limit, the measurement interval determination unit 215 prolongs the measurement interval for the next measurement made by the temperature sensor for the sensor code (step S107). As an example, the measurement interval is set to 15 seconds. When the above-mentioned conditions are not satisfied, the measurement interval determination unit 215 sets the measurement interval for the temperature sensor for the sensor code to an initial time (step S108). As an example, the measurement interval is set to 10 seconds.

The measurement interval determination unit 215 transmits the sensor code and the measurement interval to the read time storage unit 211 and transmits new five measured temperatures including the latest measured temperature and four temperatures that are most recently measured four times in the past, together with the sensor code, to the measured temperature storage unit 214 (S109).

When the read time storage unit 211 receives the sensor code and the measurement interval, the read time storage unit 211 calculates the next read time based on the measurement interval, stores it, and removes the flag indicating that the process of the sensor code is performed (S110). Further, a time of a timer may be used to set the next read time instead of the measurement interval.

When the measured temperature storage unit 214 receives the sensor code and the new five measured temperatures, the measured temperature storage unit 214 stores them as the measured temperatures of the sensor code that are measured five times in the past (S111).

Next, a process of controlling the rotation speed of the cooling fan in the temperature control unit 210 will be described.

Figure 4:
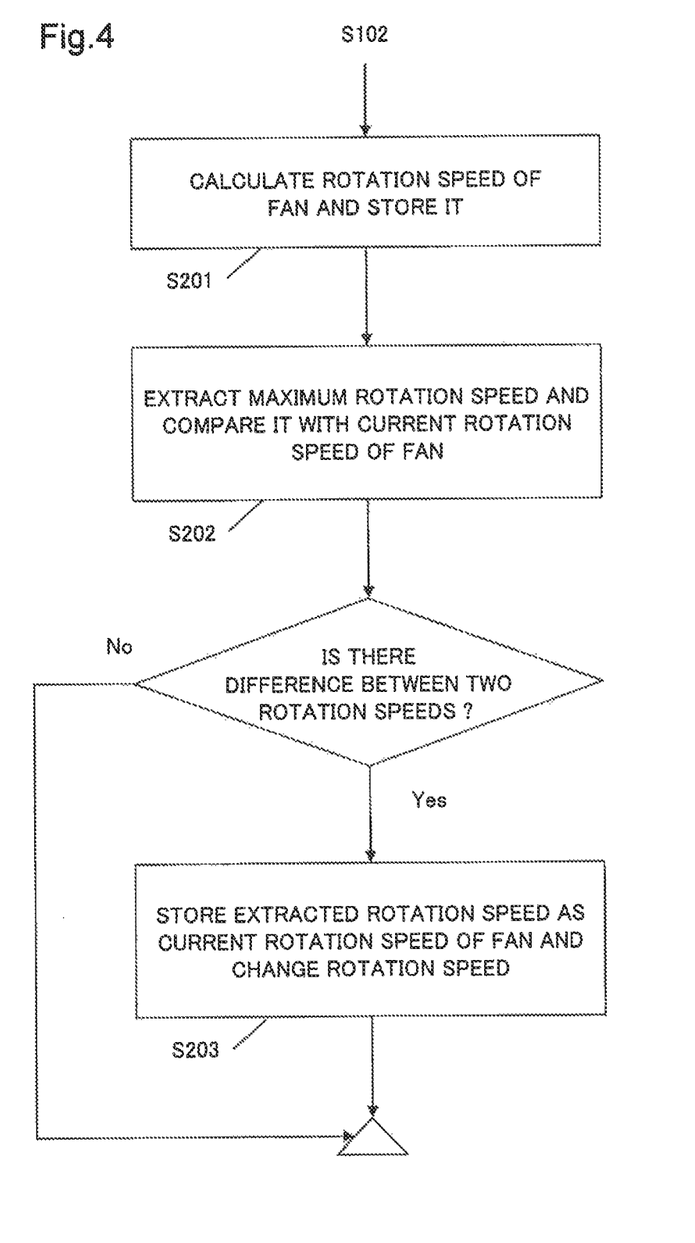
FIG. 4 is a flowchart showing a process of controlling a rotation speed of a cooling fan in a temperature control unit 210.

FIG. 4 is a flowchart showing an example of a process of controlling the rotation speed of the cooling fan in the temperature control unit 210.

The rotation speed control unit 213 stores the current rotation speed of the cooling fan and the rotation speed of the cooling fan for each sensor code. When the rotation speed control unit 213 receives the measured temperature, the rotation speed control unit 213 calculates the rotation speed and stores it as the rotation speed for the sensor code (step S201).

The rotation speed control unit 213 extracts the maximum rotation speed for each sensor code that is stored and compares it with the current rotation speed of the cooling fan (step S202). When there is a difference between two rotation speeds, the rotation speed control unit 213 stores the current rotation speed as a new rotation speed of the cooling fan and changes the rotation speed of the cooling fan to the new rotation speed (step S203).

When there is no difference between two rotation speeds, the rotation speed control unit 213 ends the process.

Next, the calculation of the rotation speed of the cooling fan will be described.

FIG. 5 shows a relationship between the measured temperature and the rotation speed of the cooling fan. As shown in FIG. 5, a stepwise relationship between the measured temperature and the rotation speed of the cooling fan is determined in advance. The rotation speed matched with the measured temperature is determined from this table.

The above-mentioned method of calculating the rotation speed of the cooling fan is shown as an example. There are various means of calculating the rotation speed of the cooling fan and the descriptions of them will be omitted.

As described above, by using the present invention, based on a plurality of the temperatures that are measured a plurality of times in the past such as the latest measured temperature and the temperatures that are measured five times in the past or the like, the presence or absence of the temperature increasing trend is determined. Therefore, an influence of measurement accuracy of the temperature sensor, erroneous measurement that suddenly occurs, or the like can be suppressed. Further, when the temperature inside the device is stable and high, the long measurement interval is not used, Therefore, the temperature of the electronic component can be made more stable. Further, when all the measured temperatures are equal to or lower than the normal upper limit, the measurement interval is prolonged. Accordingly, unnecessary temperature control can be avoided.

Accordingly, by using the present invention, the temperature control using the cooling fan in the electronic device can be made more efficiently and more stably.

Figure 6:
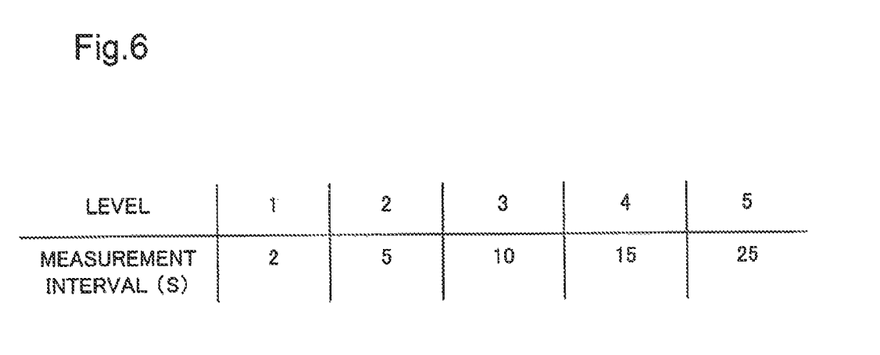
FIG. 6 shows an example of a relationship between a level and a measurement interval.

Further, as shown in FIG. 6, for example, the measurement interval may be classified into five levels, level 1 to level 5, whose time intervals are different from each other and in steps S105 and S107, the measurement interval may be changed step-by-step.

As described above, by using the present invention, the measurement interval is classified into multiple stages. Therefore, the temperature control can be made more stably.

What is claimed is:

1. An electronic device including
   a cooling fan,
   at least one temperature measurement unit, and
   a temperature control unit which controls a rotation speed of the cooling fan based on the measured temperature measured by the temperature measurement unit to control the temperature inside the device characterized in that
   the temperature control unit stores at least a plurality of measured temperatures that are measured at predetermined time intervals in the past in chronological order from the latest measured temperature, stores a normal temperature range for each temperature measurement unit, determines the presence or absence of a temperature increasing trend based on the plurality of measured temperatures and the latest measured temperature that are stored, shortens the time interval between temperature measurements from the current time interval when it is determined that the temperature increases, determines whether or not the plurality of measured temperatures and the latest measured temperature are included in the normal temperature range when it is determined that the temperature does not increase, prolongs the time interval between temperature measurements from the current time interval when all the measured temperatures are included in the normal temperature range, and does not change the time interval between temperature measurements when at least one measured temperature is not included in the normal temperature range.

2. The electronic device according to claim 1 in which it is determined that the temperature increases when the latest measured temperature is higher than the normal temperature range.

3. The electronic device according to claim 1 in which it is determined that the temperature increases when the plurality of measured temperatures and the latest measured temperature that are stored monotonically increase with time.

4. The electronic device according to claim 1 in which when there is a positive correlation between the plurality of measured temperatures and the latest measured temperature that are stored and the time, it is determined that the temperature increases.

5. A method for controlling temperature of an electronic device which includes a cooling fan, at least one temperature measurement unit, and a temperature control unit which controls a rotation speed of the cooling fan based on the measured temperature measured by the temperature measurement unit to control the temperature inside the device is characterized by comprising the steps of:
   storing at least a plurality of measured temperatures that are measured at predetermined time intervals in the past in chronological order from the latest measured temperature,
   storing a normal temperature range for each temperature measurement unit and determining the presence or absence of a temperature increasing trend based on the plurality of measured temperatures and the latest measured temperature that are stored, and
   shortening the time interval between temperature measurements from the current time interval when it is determined that the temperature increases, determining whether or not the plurality of measured temperatures and the latest measured temperature are included in the normal temperature range when it is determined that the temperature does not increase, prolonging the time interval between temperature measurements from the current time interval when all the measured temperatures are included in the normal temperature range, and not changing the time interval between temperature measurements when at least one measured temperature is not included in the normal temperature range.

6. The method for controlling temperature of an electronic device according to claim 5 in which when the latest measured temperature is higher than the normal temperature range, it is determined that the temperature increases.

7. The method for controlling temperature of an electronic device according to claim 5 in which when the plurality of measured temperatures and the latest measured temperature that are stored monotonically increase with time, it is determined that the temperature increases.

8. The method for controlling temperature of an electronic device according to claim 5 in which when there is a positive correlation between the plurality of measured temperatures and the latest measured temperature that are stored and the time, it is determined that the temperature increases.

* * * * *

UNITED STATES PATENT AND TRADEMARK OFFICE
CERTIFICATE OF CORRECTION

| | | |
|---|---|---|
| PATENT NO. | : 9,439,323 B2 | Page 1 of 1 |
| APPLICATION NO. | : 14/023074 | |
| DATED | : September 6, 2016 | |
| INVENTOR(S) | : Masaaki Kitano | |

It is certified that error appears in the above-identified patent and that said Letters Patent is hereby corrected as shown below:

Title page, item (57), line 14 of Abstract, "when the all are included" should read
--when all the measured temperatures are included--.

Signed and Sealed this
Fifteenth Day of November, 2016

Michelle K. Lee
*Director of the United States Patent and Trademark Office*